(12) United States Patent
Shin et al.

(10) Patent No.: US 7,879,536 B2
(45) Date of Patent: Feb. 1, 2011

(54) METHOD FOR FORMING HIGH-RESOLUTION PATTERN HAVING DESIRED THICKNESS OR HIGH ASPECT RATIO USING DRY FILM RESIST

(75) Inventors: Dong-Youn Shin, Daegu-si (KR);
Dong-Soo Kim, Daejeon-si (KR);
So-Nam Yun, Daejeon-si (KR);
Young-Bog Ham, Daejeon-si (KR);
Byung-Oh Choi, Daejeon-si (KR)

(73) Assignee: Korea Institute of Machinery & Materials (KR)

( * ) Notice: Subject to any disclaimer, the term of this patent is extended or adjusted under 35 U.S.C. 154(b) by 1078 days.

(21) Appl. No.: 11/612,917

(22) Filed: Dec. 19, 2006

(65) Prior Publication Data

US 2007/0259293 A1 Nov. 8, 2007

(30) Foreign Application Priority Data

May 3, 2006 (KR) ...................... 10-2006-0039982

(51) Int. Cl.
*G03F 7/26* (2006.01)
(52) U.S. Cl. ..................................... 430/324
(58) Field of Classification Search ................. 430/322, 430/324, 330
See application file for complete search history.

(56) References Cited

U.S. PATENT DOCUMENTS

| 6,074,893 A * | 6/2000 | Nakata et al. ............... 438/106 |
| 6,221,562 B1 * | 4/2001 | Boyd et al. .................. 430/314 |
| 2003/0087179 A1 | 5/2003 | Iwasaki |
| 2003/0116866 A1 * | 6/2003 | Cher 'Khng et al. ........ 257/780 |
| 2003/0143470 A1 * | 7/2003 | Nolscher et al. ............... 430/5 |
| 2005/0079338 A1 * | 4/2005 | Toyoda ..................... 428/304.4 |
| 2005/0122040 A1 * | 6/2005 | Duineveld et al. .......... 313/506 |
| 2006/0009020 A1 * | 1/2006 | Tanaka ....................... 438/597 |
| 2006/0063111 A1 | 3/2006 | Ali et al. |
| 2006/0223313 A1 * | 10/2006 | Yoon et al. .................. 438/687 |
| 2007/0209437 A1 * | 9/2007 | Xue et al. ................. 73/514.31 |

FOREIGN PATENT DOCUMENTS

WO 2006025016 A1 3/2006

* cited by examiner

*Primary Examiner*—Kathleen Duda
*Assistant Examiner*—Brittany Raymond
(74) *Attorney, Agent, or Firm*—Cantor Colburn LLP

(57) ABSTRACT

Disclosed herein is a method for forming a pattern, comprising: attaching a single-layer or multi-layer dry film resist made of a semi-solid or solid material to part or all of the surface of a substrate; exposing the dry film resist to light either by irradiating a focusable energy beam directly onto the resist or by projecting a specific wavelength range of light onto the resist, to form a region to be filled with a functional material; charging the functional material into the formed region using a method such as inkjetting; drying the functional material; and removing the dry film resist, thus obtaining the desired pattern.

28 Claims, 5 Drawing Sheets

US 7,879,536 B2

METHOD FOR FORMING HIGH-RESOLUTION PATTERN HAVING DESIRED THICKNESS OR HIGH ASPECT RATIO USING DRY FILM RESIST

BACKGROUND OF THE INVENTION

1. Field of the Invention

The present invention relates to a method for forming a high-resolution pattern, and more particularly to a method for forming a high-resolution pattern having a high aspect ratio, comprising the steps of: an attachment step of attaching a dry film resist onto a substrate; an exposure step of exposing a dry film resist to light either by irradiating a focusable energy beam directly onto the dry film resist without using a mask or a diffractive optical element, or by projecting a specific wavelength range of light onto the dry film resist through a mask or a diffractive optical element, to pattern the dry film resist into the desired shape, thus forming a pattern; a pattern template-forming step of removing the exposed region using a development process; and a deposition step of depositing a functional material into the region from which the dry film resist was removed.

2. Description of the Prior Art

Generally, photolithography is used to form patterns for use in electronic devices. As used herein, the term "photolithography" refers to a technique of forming a shape using solubility resulting from a photochemical reaction. Specifically, photolithography comprises inducing a photochemical reaction on either a film sensitive to a given wavelength of light or a liquid photoresist, selectively depending on a portion exposed to light passed through a mask and a portion unexposed to the light, and subjecting the resulting film or photoresist to various processes, including development, deposition and removal, to finally make the desired pattern.

However, this photolithography method has problems in that a large amount of material is wasted and a process is complicated, leading to a reduction in efficiency. Also, because a large-area mask is used, it is difficult to implement a new design in a short time.

Also, in a thick film process of depositing a functional material for patterns to a thickness of the micrometer scale or larger using a process such as sputtering or CVD in a short time, photolithography is unsuitable in terms of process efficiency. Thus, to overcome these problems with photolithography, an inkjet patterning method that can be used to make patterns directly on a substrate without using any mask has been proposed.

This inkjet patterning method will now be described with reference to FIGS. 1a and 1b.

As shown in FIG. 1a, a functional material of forming a pattern is deposited on a substrate 10 from an inkjet print head H, and is dried to remove an unnecessary ink carrier vehicle from the functional material. To aid in the understanding of the prior inkjet patterning method, the following example is given. The content of a functional material to be patterned, having a specific gravity of 10, is assumed to be 50 wt % based on the total weight of ink. Also, the content of a carrier vehicle(s) having an average specific gravity of 1, to be removed upon drying, is assumed to be 50% based on the total weight of the ink. Herein, the volume fraction of the fractional material based on the total volume of ink is about 9%.

Omitting complex physical phenomena to promote understanding, it is assumed that the linewidth that can be patterned with an inkjet is fixed, and that a uniform decrease in thickness occurs. As a result, the thickness of a pattern remaining after drying is only 96 of the thickness of an initial pattern.

When such an inkjet is used to form a pattern, there is a problem in that an undesired excessive decrease in thickness occurs depending on the composition of ink, and this phenomenon is shown in FIG. 1a. Also, to form the pattern so that it has high resolution, that is, to reduce width, it is general to reduce the size of an ink drop. When a smaller ink drop is used in order to achieve high resolution as described above, a smaller amount of ink is deposited per unit area, as shown in FIG. 1b. As a result, the thickness of the resulting pattern is decreased in proportion to the decrease in linewidth, and thus it is physically difficult to achieve both objects of reducing linewidth alone and simultaneously maintaining the desired pattern thickness.

Also, when the size of the ink drop (i.e., functional material) is reduced to achieve high resolution, the targeting error of the ink drop increases relative to the scale of the pattern, thus causing a serious patterning error and forming an incorrect pattern.

SUMMARY OF THE INVENTION

The present invention has been made to solve the above-described problems occurring in the art, and it is an object of the present invention to achieve a high-resolution pattern by exposing a dry film resist to light either by irradiating a focusable energy beam directly and selectively onto the dry film resist attached onto a substrate or by projecting a specific wavelength range of light onto the dry film resist through a mask or a diffractive optical element, removing the exposed region through a development process, and depositing a functional material into the region from which the dry film resist was removed. Another object of the present invention is to obtain a desired pattern thickness by setting the thickness of an initial dry film resist to be sufficient in view of a reduction in thickness resulting from the drying of ink, and charging ink into the selected thickness of the film. Still another object of the present invention is to provide a substrate having formed thereon a free pattern, for use in said method.

To achieve the above objects, the present invention provides a method for forming a high-resolution pattern having a desired thickness or high aspect ratio using a dry film resist, the method comprising: an attachment step of attaching a dry film resist onto a substrate in a sticky or adhesive manner; an exposure step of exposing the dry film resist to light either by irradiating a focusable energy beam selectively and directly onto the dry film resist or by projecting a given wavelength range of light onto the dry film resist through a traditional mask or a diffractive optical element, to pattern the dry film resist into the desired shape; a pattern template-forming step of removing the dry film resist from the exposed region through a development process; and a deposition step of depositing a functional material selectively into the region from which the dry film resist was removed.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Figure 1A:
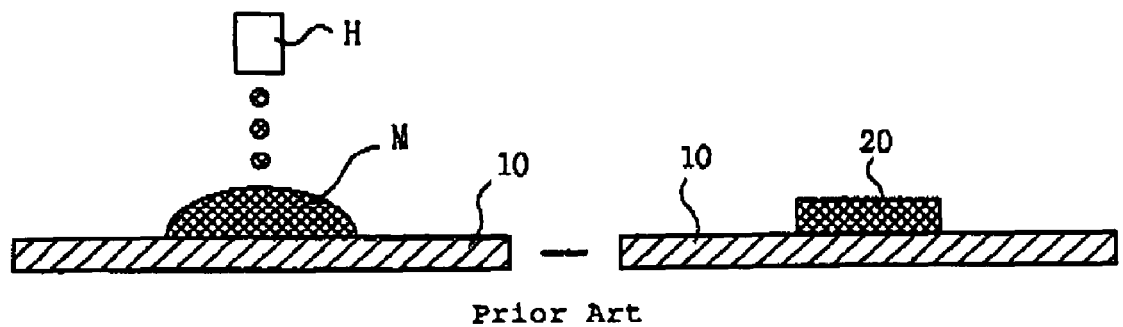
FIG. 1 is a schematic process diagram showing a method of forming a pattern according to the prior inkjet patterning method.
Figure 1B:
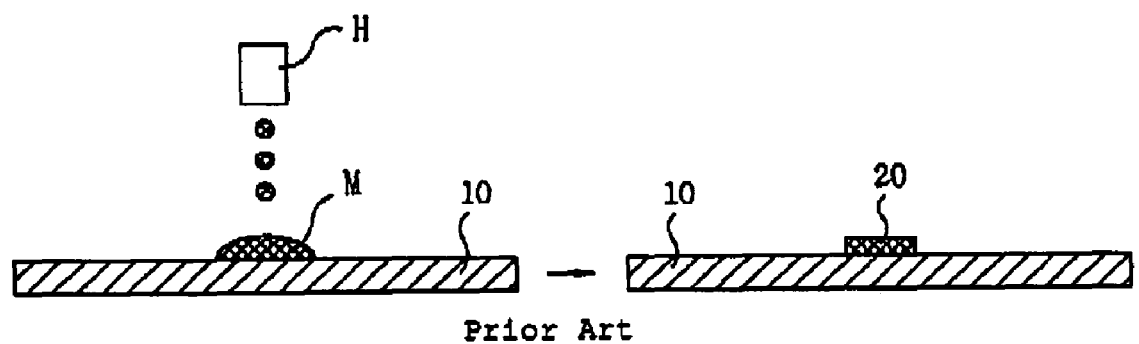

Hereinafter, the present invention will be described in further detail with reference to the accompanying drawings.

As described above, the present invention provides a method for forming a high-resolution pattern, which can achieve a precise pattern linewidth and thickness by reducing width and, at the same time, maintaining a given height, the method comprising: exposing to light a dry film resist attached onto the substrate either by irradiating a focusable energy beam selectively and directly onto the dry film resist or by projecting a specific wavelength range of light onto the dry film resist through a mask or a diffractive optical element; removing the dry film resist from the exposed region to be deposited with a functional material, through a development process; and depositing the functional material into the region from which the dry film resist was removed. For this purpose, the inventive method comprises: an attachment step of attaching a dry film resist onto a substrate in a sticky or adhesive manner; an exposure step of exposing the dry film resist to light either by irradiating a focusable energy beam selectively and directly onto the dry film resist or by projecting a specific wavelength range of light onto the dry film resist through a mask or a diffractive optical element, to pattern the dry film resist into the desired shape; a development step of developing the exposed region; and a deposition step of depositing a functional material into the region from which the dry film resist was removed.

Particularly, in the case where a thick film having a thickness of 1 micrometer or more is required, assuming that the volume fraction of a functional material remaining as a film shape after the drying of ink is $\alpha$ vol %, and that the pattern thickness to be achieved is $\beta$ µm, a semi-solid or solid dry film resist having a thickness of $100 \times \beta/\alpha$ µm or more will be attached on the substrate in a sticky or adhesive form using, for example, a laminator.

However, the method of attaching the dry film resist onto the substrate is not limited only to the use of the laminator, but encompasses any conventional method capable of attaching a film-shaped product to the substrate.

The dry film resist attached to the substrate through the above-described method is exposed directly to the focusable energy beam or is exposed to a specific wavelength range of light through a mask or a diffractive optical element, and then a region that can be filled with ink is formed in the dry film resist through a development process. The charged ink, i.e., the functional material, will be formed into a film after drying in order to function as a pattern.

Also, in order to provide a substrate having a free pattern formed thereon for use in said method, the dry film resist is exposed by light according to the shape of the pattern required, either by irradiating a focusable energy beam selectively and directly onto the dry film resist or by irradiating a specific wavelength range of light onto the dry film resist through a mask or a diffractive optical element. Then, the exposed dry film resist is selectively removed through a development process. The region from which the dry film resist was removed can be filled with one or more functional materials selected from among the following materials: conductive organic materials such as PEDOT (poly(3,4-ethylene dioxythiophene))-PSS(poly(4-styrenesulfonate)), conductive inorganic materials such as copper or aluminum nanoparticles, conductive material precursors such as organometallic compounds, organic/inorganic fluorescent or phosphorescent substances for use in electroluminescent devices, electrical insulators or dielectrics, and organic/inorganic semiconductor materials.

However, said materials are merely examples of such functional materials, and the choice of the functional material is determined depending on the intended use thereof.

Hereinafter, the method for forming the high-resolution pattern having a desired thickness or high aspect ratio according to the present invention will be described in greater detail.

The pattern formation method according to the present invention comprises: an attachment step (S1) of attaching a dry film resist 30 onto a substrate 10 in a sticky or adhesive manner; an exposure step (S2) of exposing the dry film resist 30 to light by irradiating a focusable energy beam 25 directly onto the dry film resist 30, to pattern the dry film resist 30 into the desired shape; a pattern template-forming step (S3) of removing the exposed dry film resist using a development process in order to form a pattern template; and a deposition step (S4) of depositing a functional material into the pattern template to form a pattern.

Herein, the material of the substrate 10 is not specifically limited as long as it is used to form the pattern 20 thereon and is conventionally used in the art.

According to a preferred embodiment of the present invention, if the pattern 20 is already formed on the substrate 10, no specific layer is deposited on the pattern 20, but one or more layers selected from among the following layers may, if necessary, be deposited on the substrate 10: a protective layer for protecting the substrate 10 or the pattern 20 formed on the substrate 10 from contaminants generated before, during or after processing; a light shielding layer for protecting the substrate 10 or the pattern 20 formed on the substrate 10 either by shielding the energy of the focusable energy beam 25 or a specific wavelength range of light without transferring the energy to the underlying structure or by absorbing the energy so as to be removed by itself; an adhesive layer for increasing the adhesion of the dry film resist 30 to the substrate 10; and a removable film for protecting the adhesive layer during the storage of the substrate.

Herein, said layers can consist of a single layer or a plurality of layers.

Meanwhile, either the light shielding layer or the protective layers can be deposited first in sequence, and can consist of a plurality of light shielding layers or protective layers, and the adhesive layer is generally formed at the uppermost portion of the substrate 10 and is protected with the removable film during the storage of the substrate.

Also, to make the removal of said layers easy, these layers are made of, for example, materials which are easily removed by an energy beam having the same wavelength ($\lambda 1$) as or a wavelength ($\lambda 2$) different from the wavelength of the focusable energy beam for forming the pattern 20, materials containing a light absorber that absorbs said wavelength well, or materials that are highly soluble in a solvent which is used in washing after a process.

Also, according to the choice and mixing of the materials used, said layers can perform a plurality of functions without distinction.

The dry film resist 30 is attached onto the substrate 10 in a sticky or adhesive manner, as described above, and will now be described. The material for forming the dry film resist 30 is not specifically limited as long as it is positive or negative photosensitive resin, which is semi-solid or solid at room temperature, and easily undergoes a photochemical reaction in response to direct irradiation with the focusable energy beam 25, such as a laser beam, or by irradiation with a specific wavelength range of light through a mask or a diffractive optical element, so that it shows a difference in solubility in a developing solution between the exposed region 35 and a unexposed region.

As used herein, the term "positive photosensitive resin" refers to photosensitive resin, the exposed region of which is removed through a development process. When the positive photosensitive resin is used, the region thereof to be deposited with the functional material can be exposed to light by irradiating the focusable energy beam directly onto the region or by irradiating a specific wavelength range of light onto the region through a mask or a diffractive optical device, and can then be removed through a development process.

As used herein, the term "negative photosensitive resin" refers to photosensitive resin, the unexposed region of which is removed through a development process. When the negative photosensitive resin is used, both side regions of the region to be deposited with the functional material can be exposed to light by irradiating the regions with a focusable energy beam or by irradiating the regions with a specific wavelength range of light through a mask or a diffractive optical element, and then the unexposed region thereof can be removed through a development process, thus forming so-called "bank structures". In this case, the functional material is deposited into the region between the bank structures, from which the dry film resist was removed.

According to the present invention, the use of the positive photosensitive resin is preferable to the use of the negative photosensitive resin, and the present invention will now be described with reference to the dry film resist made of the positive photosensitive resin.

Meanwhile, the dry film resist 30 can be composed of a single layer consisting of a single material or a plurality of materials, or a plurality of layers. Particularly, if the dry film resist 30 is composed of a plurality of layers, it can be composed of: one or more adhesive layers attached to the lower surface of the dry resist film 30 in order to easily attach the dry film resist to the substrate 10; a light shielding layer for preventing the focusable energy beam 25, irradiated directly, or a specific wavelength range of light, projected through the mask or diffractive optical element, from being transmitted through and under the dry film resist; a photosensitive layer made of a resin, which is easily exposed to a focusable energy beam or a specific wavelength range of light projected through the mask or diffractive optical element; a protective layer for preventing contamination from occurring before or during processing; and an uppermost removable film and a lowermost removable film, which are located at the uppermost portion and lowermost portion of the dry film resist, respectively. Herein, the uppermost removable film serves to protect the substrate 10 during the storage of the substrate, and the lowermost removable film prevents foreign matter from adhering or becoming attached to the adhesive layer. Also, each of said layers can be selectively used in the present invention.

On the lower surface of the uppermost removable film, a surface-modifying surfactant is coated, which serves to control surface wettability when the functional material (ink) is deposited after the uppermost removable film has been removed, followed by light exposure and development processes. Alternatively, the surfactant may be contained in the photosensitive layer or the protective layer. Alternatively, it can also be coated after removing the removable film.

Figure 4A:
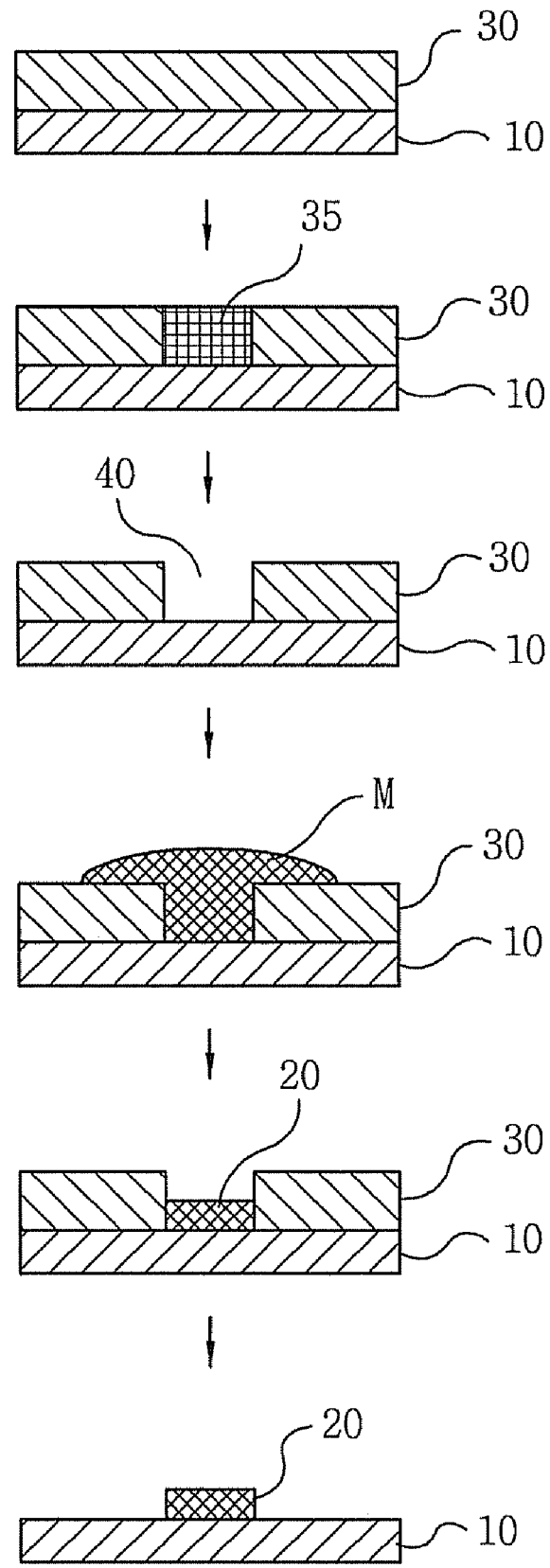
FIG. 4 illustrate process diagrams of preferred embodiments of the present invention, which show the shapes of patterns after drying according to the wettability of a dry film resist with ink.
Figure 4B:
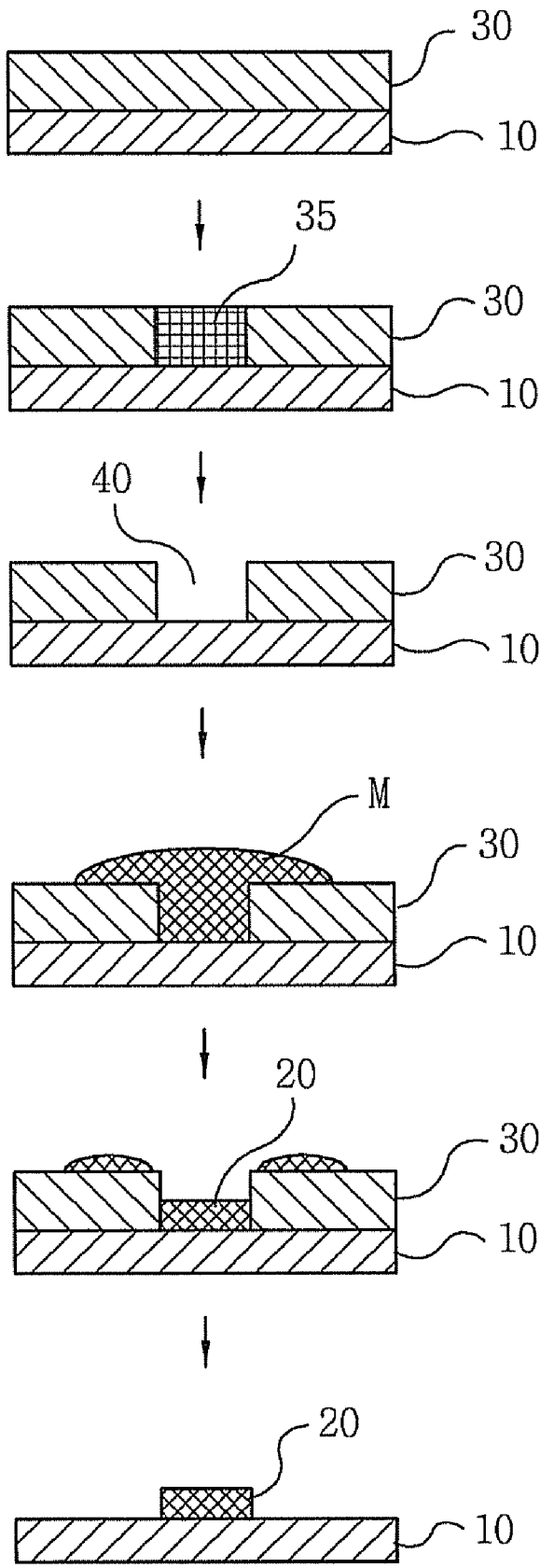

If the surface-modifying surfactant is coated so that the surface of the dry film resist has a low affinity for ink, the functional material deposited shows a strong tendency to be self-aligned to the region from which the dry film resist was removed, due its low affinity for the upper surface of the dry film resist (see FIG. 4a). On the other hand, as the wettabiliy between the upper surface of the photoresist film and the functional material increases, the functional material spreads thinly on the dry film resist, so that it shows a strong tendency to be deposited in a state in which the functional material on the dry film resist and the functional material in the region from which the dry film resist was removed are separated from each other after drying, or are weakly connected with each other (see FIG. 4b).

Alternatively, a material having suitable wettability (such as non-affinity or affinity) with the functional material may also be deposited on the lower surface of the uppermost removable film.

Alternatively, after the removal of the uppermost removable film, the surface properties of the dry film resist can be changed as required through dry treatment, such as room temperature plasma or corona treatment.

The dry film resist 30 can contain suitable additives to control adhesion to the substrate 10 or the functional material M, or to maintain required wettability (such as hydrophobicity or hydrophilicity) with the functional material, or to impart suitable flexibility to the dry film resist 30, or to increase the absorption of or sensitivity to a focusable energy beam or a specific wavelength range of light projected through a mask or a diffractive optical element.

Alternatively, the dry film resist, which is used in the present invention, can be selected from products that are commercially available from Kolon Industries., Co., SKC, Dongjin Semichem Co., LG Chemical Co., Cheil Industries Inc., Dongwoo Fine-Chem Co., Ltd., and Torayseahan Co.

In the pattern formation method according to the present invention, before the step (S1) of attaching the dry film resist 30 onto the substrate 10, a protective layer can be formed between the substrate and the dry film resist, i.e., on the substrate and/or under the dry film resist, in order to easily remove dry film resist residue which remains on the substrate after the dry film resist, having been exposed to light, is subjected to the development process. This protective layer can be made of a water-soluble polymer when a polar solvent is used in a washing process, and it can be made of a water-insoluble polymer when a non-polar solvent is used in a washing process, but the scope of the present invention is not limited thereto. As the protective layer and a solvent for use for the removal thereof, materials are selected which do not influence the deposited functional material.

The substrate 10 and the dry resist film 30, which are used in the present invention, have been described above. Hereinafter, the inventive method will be described, and comprises: an attachment step (S1) of attaching the dry film resist 30 onto the substrate 10 in a sticky or adhesive manner; an exposure step (S2) of exposing the dry film resist 30 to light either by irradiating a focusable energy beam 25 onto the dry film resist 30 or by projecting a given wavelength range of light onto the dry film resist 30 through a traditional mask or a diffractive optical element, to pattern the dry film resist 30 into the desired shape; a pattern template-forming step (S3) of removing the exposed dry film resist through a development process, thus forming a pattern template 40; and a deposition step of depositing a functional material M into the pattern template.

Figure 2A:
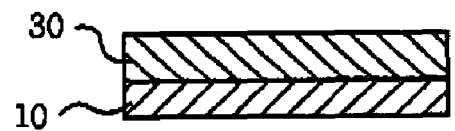
FIG. 2 is a schematic process diagram showing a patterning method according to the present invention.

First, the attachment step (S1) of attaching the dry film resist 30 onto the substrate 10 will be described with reference to FIG. 2a. The substrate 10 and the dry film resist 30 are attached to each other by lamination, and can be heated in order to make the operation easy (see FIG. 2a). However, the method of depositing the dry film resist in said step is not specifically limited in the present invention as long as it is an attachment method that is generally used in the art.

The attachment step (S1) is followed by the exposure step (S2) of exposing the dry film resist to light by irradiating the focusable energy beam 25 directly onto the dry resist film or by projecting a specific wavelength range of light onto the dry film resist through a mask or a diffractive element, thus patterning the dry film resist into the desired shape. Then, the pattern template-forming step of removing the exposed region 35 through a development process to form the pattern template 40 is carried out.

Figure 2B:
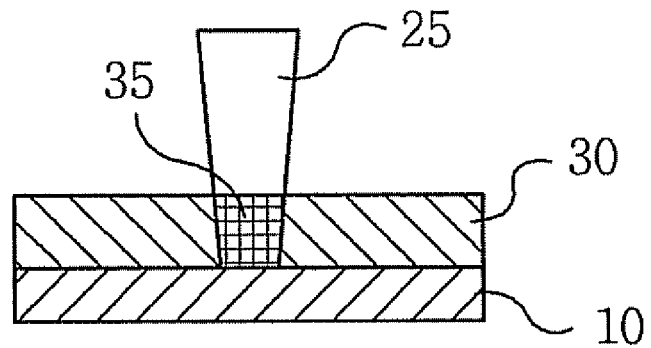
Figure 2C:
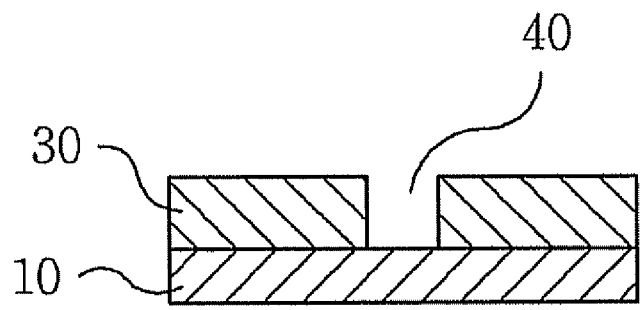

Specifically, the dry film resist 30 attached to the substrate 10 is patterned into the desired shape to form the exposed region 35 in the dry film resist 30, and then a partially removed region of the dry film resist 30, which is the pattern template 40, is formed (see FIGS. 2b and 2c).

Herein, the exposure of the dry film resist to light can be performed by irradiating the focusable energy beam 25, such as a laser beam, as described above, onto the dry film resist, and the energy beam can also be irradiated directly onto the substrate 10 while controlling the focusable energy beam using digitized data on beam output, beam spot size, scanning rate, and an image to be patterned, and using a computer.

At this time, a laser direct imaging (LDI) process can be used which can perform imaging directly from data without a photo mask. A system for conducting the laser direct imaging process is commercially available from various companies, including Orbotech, Pentax, Electro Scientific Industries, LPKF Laser & Electronics AG, Creo, Mania-Barco, Dainippon Screen, Automa-Tech, Ball Semiconductors, Preco Industries and the like. The wavelength of the laser beam used in this case must be consistent with the wavelength range of light to which the dry film resist is sensitized. In the present invention, the process of exposing the dry film resist to light by irradiating a laser beam onto the resist is preferably used, but is not limited thereto.

Other focusable energy beams may include E-beams, focused ion beams and the like, which can be used in the light exposure process of the present invention as long as the dry film resist can be exposed thereto.

Also, the dry film resist can be exposed to light by projecting a specific wavelength range of light onto the dry film resist through a mask or a diffractive optical element. In this case, the specific wavelength range of light must agree with the wavelength range of light to which the dry film resist is exposed.

Figure 2D:
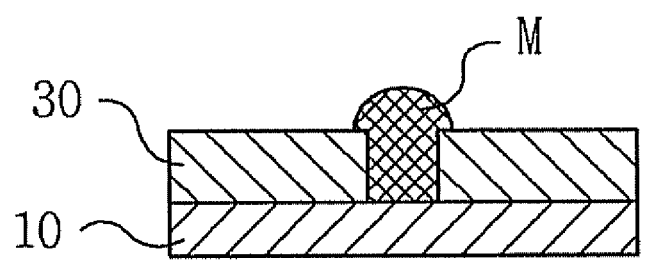
Figure 2E:
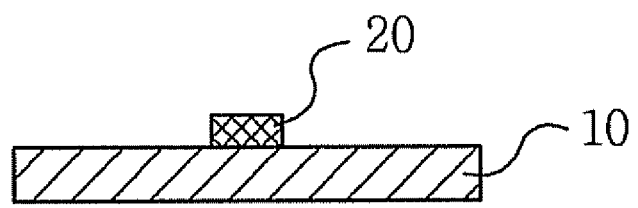

Into the region 40 from which the dry film resist 30 was selectively removed through the patterning step for forming the pattern template as described above, the functional material is finally deposited, thus forming the region that will remain as the pattern 20 (see FIGS. 2d and 2e).

Meanwhile, when the focusable energy beam such as a laser beam is used in the patterning step of forming the pattern template by selectively exposing the dry film resist 30 to light and removing the exposed region through a development process, a beam shaper (S) such as a mask or a diffractive optical element can be selectively used to control the shape of the beam so as to be advantageous for the patterning.

Figure 3:
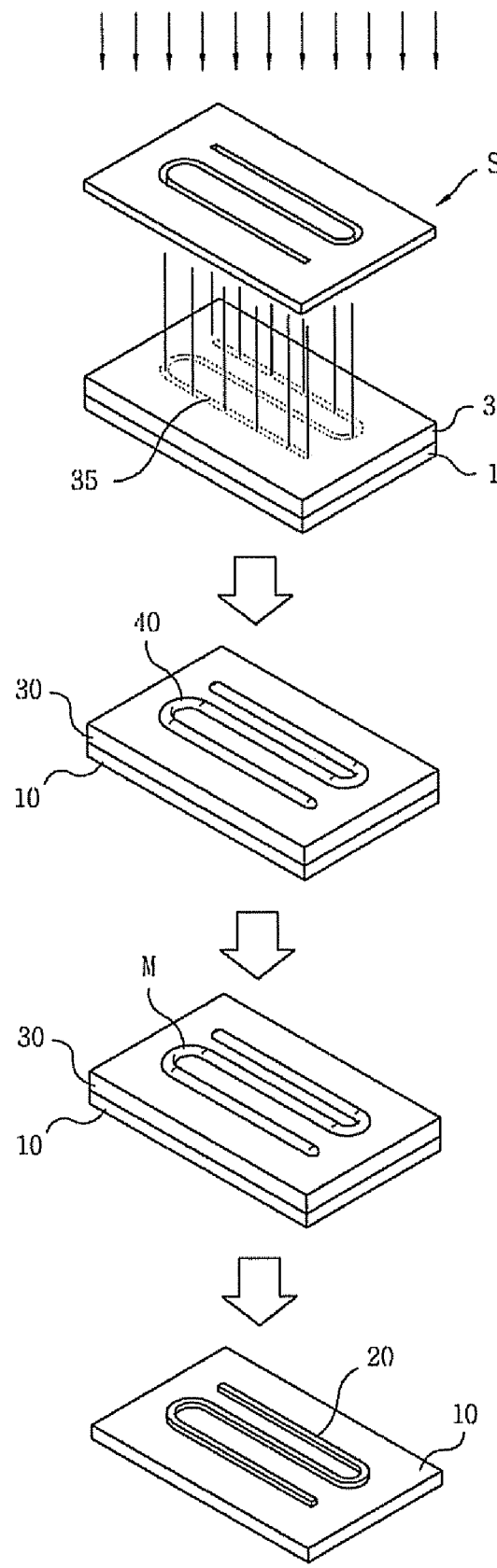
FIG. 3 is a schematic process diagram showing a method of easily forming a complex high-resolution pattern according to the present invention.

Herein, the use of the beam shaper (S) encompasses, in addition to the use of a mask for large-area patterning in conventional photolithography, the use of a partial mask located on a beam path to control the shape of the focusable energy beam 25, such as a laser beam. Also, the use of a diffractive optical element includes the use of a partial diffractive optical element, which covers the entire area of a region to be patterned, or which is located on a beam path to control the shape of the focusable energy beam, such as a laser beam (see FIG. 3).

In said method, a complex pattern can be formed using the beam shaper with a mask and/or a diffractive optical device for controlling the shape of the beam, either through maskless laser direct writing, in which a focusable energy beam such as a laser beam is irradiated directly onto the substrate without the use of a mask or diffractive optical element other than the shape beam, or through mask-based laser scanning, in which a focusable energy beam such as a laser beam is scanned on the substrate using a mask or diffractive optical element separately from the beam shaper. In addition to the use of the mask and/or diffractive optical element for the beam shaper, the use of the mask on the substrate embraces, in addition to the use of a large-area mask that can achieve large-area patterning, as in the prior photolithography, the use of a mask on a portion of the substrate. In addition to the use of the mask and/or diffractive optical element for the beam shaper, the diffractive optical element on the substrate can be used on all or part of the substrate, like the use of the mask on the substrate.

In order to control the shape of the focusable energy beam 25 through the beam shaper S, the diffractive optical element is preferable to the mask, but the invention is not specifically limited thereto.

Meanwhile, in the pattern template-forming step (S3), the focusable energy beam can be irradiated on the back side of the substrate, but not on the upper side.

The pattern template 40 is formed by patterning the dry resist film according to the above-described method. The functional material is deposited into the formed pattern template 40, thus forming the pattern 20 (see S3).

Hereinafter, the deposition step (S4) for forming the pattern 20 will be described.

The method for conducting the deposition step is not specifically limited as long as it is conventionally used in the art. For example, the following method can be used.

Examples of the method for depositing the pattern 20, which can be used in the present invention, include: an inkjet method of spraying and depositing the functional material; a screen printing method of depositing the pattern on the substrate using a stencil mask (also called "screen") and a squeegee; an electrostatic printing method of depositing the pattern using a functional material having electric charges; an offset printing method of placing the functional material on a rubber sheet (called "blanket") and transferring the functional material on the blanket to the substrate; a gravure printing of making a gravure plate, placing the functional material on the blanket, as in offset printing, and then indirectly printing the substrate using the functional material; a flexographic printing method (a kind of relief printing) that uses flexible resin or a rubber relief plate; a printing method that uses a soft mold; a spin coating method of depositing the functional material using a method in which a plate to be coated is rotated while a polymer is dropped on the center of the rotating plate so that the polymer is coated on the entire surface of the plate due to the rotating centrifugal force of the plate; and a slit coating method of depositing the functional material using a slit coater.

Also, it is possible to use a drop-on-demand method of discharging ink on desired regions. Examples of the drop-on-demand method include a thermal method, which uses a thermal heater as a driving source for the discharge of ink, and a piezoelectric method of pushing out ink using pressure generated by a piezo-element.

In addition, it is also possible to use a continuous ink jet method of depositing the functional material, in which ink is always discharged and in which the direction of ink is changed at the desired time.

Also, the deposition step (S4) can be performed by depositing the functional material directly onto the substrate using digitized data through a laser transfer method such as MAPLE DW or laser-induced thermal imaging. As used herein, the term "laser transfer method" refers to a technique of forming a band-shaped pattern on the substrate by preparing on transfer paper a film to be transferred, exposing to a laser beam a portion of the film to be transferred, to form an image, transferring the imaged film onto the substrate and detaching the film from the substrate.

Furthermore, the deposition step (S4) can also be performed by depositing a fluid stream sprayed (atomized) or vaporized through a nozzle, onto the substrate 10 using digitized data.

Meanwhile, in the above-described inventive method comprising exposing the dry film resist 30 to light and developing it to form the pattern template 40, and then depositing the functional material into the pattern template 40 through an inkjet method to form the pattern 20, it is also possible to deposit the functional material M using a combination of the functional material and any one of heat, plasma, and laser and ion beams.

Meanwhile, the deposition step (S4) can also be performed using a dip coating method. Specifically, it is also possible to form the pattern in an electroless plating manner by depositing a seed material for electroless plating into the pattern template 40 and then dipping the substrate in a chemical reaction solution.

The deposition step (S4) can also be performed by depositing the functional material on the substrate 10 using a chemical vapor deposition (CVD) method.

According to a preferred embodiment of the present invention, an inkjet method, which is a direct patterning method, is preferably used to deposit the expensive functional material, but other methods can also be used as long as they do not impair the purpose of the present invention.

Meanwhile, it is preferable to increase deposition efficiency by heating the substrate 10, having the dry film resist 30 formed thereon, during the deposition step (S3).

After depositing the liquid functional material M, a drying step is carried out. If necessary, unnecessary functional material remaining on the dry film resist can also be washed away with, for example, a blade, scraper or wiper, after the drying step.

After the deposition step (S4) and the drying step, the functional material made of, for example, silver nanoparticles, sometimes shows increased resistance because the particles are loosely connected with each other. In this case, it is preferable to conduct heat treatment at 100° C. or higher in order to bind the functional material particles tightly to each other, thus improving electrical properties.

Also, the invention method preferably comprises, after the deposition step (S4), a step of inducing the photochemical reaction (e.g., photocuring) in the functional material. In other words, the inventive method may further comprise a step of changing the physical and chemical properties of the functional material by curing the functional material using a general UV curing machine or inducing the curing of the functional material using an electron beam.

Also, the inventive method may comprise, after the deposition step (S4), a step of inducing a chemical reaction in the functional material M through chemical treatment. For example, when a colloidal electroless plating solution containing palladium is applied into the pattern template 40 using an inkjet, and a solution, containing metal ions and a reducing agent such as formaldehyde or hydrazine, is applied thereon using an inkjet in a state in which the dry resist film 30 is removed or is not removed, a reduction reaction will occur due to the patterned catalyst, thus forming a metal pattern.

In addition to the reduction reaction as described above, it is also possible to use a displacement reaction, as in displacement plating, which exploits the difference in oxidation/reduction power. Also, a chemical reaction can be used, in which a metal precursor is reduced into the desired metal by first applying the metal precursor into the pattern template 40 using an inkjet, and then immersing the substrate in a catalyst-containing reducing solution or selectively applying the reducing solution on the pattern.

The present invention is not limited to the above examples, and can encompass an example of irradiating the dry film resist having sufficient thickness with a focusable energy beam such as a laser beam and developing the light-exposed region to form the pattern template, and using the pattern template as a chemical reaction site for the functional material, which is finally patterned, as long as the example does not hinder the purpose of the present invention.

Meanwhile, after the deposition step (S4), the functional material may also be subjected to a phase change from a liquid phase to a solid phase.

In other words, after the functional material, made of, for example, a liquid metal mixture or a compound, is sprayed into the pattern template, it can be changed to a solid phase.

Also, after the functional material M is deposited, the pattern 20 is preferably irradiated with a laser or plasma beam to improve the properties thereof.

After the above-described deposition step (S4) is carried out, step (S5) is finally conducted, in which the dry film resist 30 remaining on portions other than the pattern is removed so that unnecessary functional material remaining on the dry film resist 30 is also removed, thus leaving only the pattern 20 made of the functional material.

The removal of the dry film resist 30 can be performed using a method selected from the following methods: a method that uses a solvent or solution of selectively dissolving only the dry film resist 30; a method of selectively removing the dry film resist 30 by irradiating the resist with a focusable energy beam (such as a laser beam), having a high sensitivity to the resist, and then developing the exposed region; a method comprising irradiating a focusable energy beam onto the entire surface of the dry film resist, followed by development; a method of selectively removing the dry film resist by irradiating the dry film resist with a specific wavelength range of light to which to the resist is highly sensitive, through a mask or a diffractive optical element, and then developing the exposed region; a method comprising irradiating the entire surface of the dry film resist with a specific wavelength range of light having a high sensitivity to the resist, and then developing the exposed region; a method of promoting the removal of the dry film resist by heating; and a dry etching method such as room temperature plasma, reactive ion etching or $UV/O_3$.

Also, the removal of the dry film resist or the functional material deposited on the dry film resist can be performed using a method of irradiating an energy beam having a diameter greater than that of the focusable energy beam used for patterning (i.e., the formation of the pattern template 40), and this removal method will now be described in further detail.

Specifically, assuming that the material of the dry film resist is sensitive to a energy density of 20 $mJ/cm^2$ or can be directly removed by a laser beam having an energy density of 50 mJ/cm$^2$, and that the functional material is removed by a laser beam having an energy density of 200 mJ/cm$^2$, when a laser beam is focused to a diameter of, for example, about 5 μm, the energy density thereof is 100 mJ/cm$^2$. Using this energy beam, the dry film resist is directly removed to make a pattern template 40 having a width of about 5 μm. Alternatively, the dry film resist is sensitized to a decreased energy density of 20-50 mJ/cm$^2$, and then the exposed region 35 is removed through a development process, thus making a pattern template having a width of about 5 μm. The functional material is charged into the formed pattern template and then dried. When the diameter of said laser beam is increased to greater than 5 μm in order to remove the remaining dry film resist, the energy density thereof will be decreased to less than 200 mJ/cm$^2$, so that the dry resist film can be removed, but the functional material will not be removed. With the removal of the dry film resist, the functional material deposited thereon can also be removed.

In other words, when an energy beam having a diameter larger than the diameter of the energy beam used to form the pattern template is irradiated, the dry film resist 30 and the functional material deposited thereon are removed at a power density and energy density higher than required for the removal of the dry film resist 30, but lower than required for the removal of the functional material M.

If the dry film resist 30 to be removed is positive photosensitive resin, it can be removed using an energy beam which is the same as or different from the focusable energy beam used for patterning the dry film resist 30. Also, the dry film resist 30 can be removed by exposing the dry film resist to a specific wavelength range of light suitable for the photosensitization of the resist and developing the exposed region. In this case, the energy beam can also be projected through a mask or a diffractive optical element.

Meanwhile, the dry film resist 30 does not necessarily need to be removed, and if necessary, can show other inherent functionalities. For example, when a passivation or insulation layer covering the protective film is required, the dry film resist 30 or at least one layer of the plurality of layers constituting the dry film resist can be used as a material serving this purpose. In this case, the dry film resist does not need to be removed. The negative-type dry film resist 30 is particularly useful for this case.

After the removal of the dry film resist, thermal/chemical treatment can also be carried out to improve the properties of the patterned functional material.

As can be seen from the foregoing, according to the pattern formation method of the present invention, the high-resolution pattern can be formed in a simple manner without wasting the functional material. Also, the substrate having formed thereon the free pattern according to the present invention makes it possible to effectively prepare the high-resolution pattern by irradiating the dry film resist with a focusable energy beam suitably selected depending on the kind of material of the dry film resist deposited on the substrate, to secure a region to be filled with the functional material (i.e., ink), and then filling the functional material into the region.

As described above, the substrate having formed thereon the free pattern according to the present invention makes it possible to obtain the high-resolution pattern without wasting the functional material, thus reducing the production cost of the substrate. Also, according to the present invention, a pattern having a high aspect ratio, which is difficult to obtain in the prior process, can be realized by filling the functional film using the thickness of the dry film resist to be adhered. In addition, according to the method for forming the pattern using the substrate having formed thereon the free pattern, the high-resolution pattern can be produced at high process efficiency.

Although the preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a high-resolution pattern having a desired thickness and a high aspect ratio using a dry film resist by selectively removing the dry film resist attached onto a substrate by exposure to light and depositing a functional material into a region from which the dry film resist is removed, the method comprising:

a dry film resist-attaching step (S1) of attaching onto a substrate a dry film resist having a thickness of 100*β/α (μm) or more using a laminator or the like, assuming that the volume fraction of the functional material that will finally remain as a film, is a (vol %) and that a required thickness of a pattern is β (μm);

an exposure step (S2) of exposing the attached dry film resist to light by irradiating the dry film resist with a focusable energy beam to pattern the dry film resist into a desired shape;

a pattern template-forming step (S3) of removing the exposed dry film resist through a development process to form a pattern template; and a deposition step (S4) of printing a functional material into the pattern template to form a pattern, wherein the dry film resist comprises:

a protective layer for preventing contamination from occurring during processing;

a photosensitive layer sensitive to the focusable energy beam;

a light shielding layer for preventing the focusable energy beam from being transferred below the dry film resist; and one of a surfactant layer, a polymer layer, or a surfactant-containing polymer layer for controlling wettability such as hydrophobicity or hydrophilicity with the functional material.

2. The method of claim 1, which further comprises, after the step (S4), a step (S5) of removing the dry film resist remaining on regions other than the pattern region, so that unnecessary functional material remaining on the dry film resist is also removed, thus leaving only the pattern made of the functional material.

3. The method of claim 2, wherein the removal of the dry film resist is performed by removing the dry film resist using a solvent or solution for dissolving the dry film resist and, at the same time, removing the functional material deposited on the dry film resist.

4. The method of claim 2, wherein the removal of the dry film resist and the functional film deposited on the dry film resist is performed by selectively removing only the dry film resist by irradiating the substrate with a focusable energy beam having a diameter greater than that of the energy beam used for patterning the dry film resist, when the power density and energy density of the beam required for removing the dry film resist are lower than those of the beam required for removing the functional material.

5. The method of claim 2, wherein the removal of the dry film resist is performed using a dry etching method selected from among room temperature plasma, reactive ion etching, and a UV-ozone method.

6. The method of claim 2, wherein, if the dry film resist to be removed is positive photosensitive resin, it is removed by exposing the dry film resist to light using an energy beam which is the same as or different from the focusable energy beam suitable for the photosensitization of the dry film resist, and then developing the exposed region.

7. The method of claim 6, wherein the dry film resist is removed by exposing the resist to light by projecting the focusable energy beam onto the resist through a mask or a diffractive optical element, and then developing the exposed region.

8. The method of claim 1, wherein the dry film resist further comprises:
   an uppermost removable layer for protecting the substrate during the storage of the substrate;
   an adhesive layer having sticky or adhesive force, which is attached to the lower surface of the dry film resist in order to easily attach the dry film resist to the substrate; and
   a lowermost removable film for preventing contaminants from adhering to the adhesive layer.

9. The method of claim 8, wherein one of the surfactant layer, a polymer layer, or a surfactant-containing polymer layer is coated on a lower surface of the uppermost removable layer.

10. The method of claim 1, wherein, in the step (S3) of forming the pattern template, the focusable energy beam is irradiated directly onto the substrate by controlling the focusable energy beam using digitized data on beam output, size, scanning rate, patterning.

11. The method of claim 10, wherein, in the removal of the dry film resist and the functional material deposited on the dry film resist, heating is conducted to promote removal of the dry film resist.

12. The method of claim 1, wherein the pattern template-forming step (S3) is carried out using a laser direct imaging method, in which the patterning of the dry film resist is conducted using as the focusable energy beam a high wavelength range of a laser beam highly sensitive to the dry film resist.

13. The method of claim 1, wherein, in the pattern template-forming step (S3), the patterning of the dry film resist is performed using an electron beam (E-beam) or a focusable ion beam as the focusable energy beam.

14. The method of claim 1, wherein, in the step (S3) of forming the pattern template, a beam shaper with a mask or diffractive element is used to control the irradiation shape of the focusable energy beam.

15. The method of claim 1, wherein, in the step (S3) of forming the pattern template, a mask or a diffractive optical element is used on the substrate in order to control the irradiation shape of the focusable energy beam.

16. The method of claim 1, wherein, in the step (S3) of forming the pattern template, the focusable energy beam is irradiated on a back side of the substrate, but not on an upper side of the substrate.

17. The method of claim 1, wherein the deposition step (S4) is performed using a drop-on-demand method of depositing the functional material directly onto the substrate using digitized data.

18. The method of claim 1, wherein the deposition step (S4) is performed using a continuous inkjet method of depositing the functional material directly onto the substrate using digitized data.

19. The method of claim 1, wherein the deposition step (S4) is performed using an electrostatic deposition or electrospraying method of depositing the functional material directly onto the substrate using digitized data.

20. The method of claim 1, wherein the deposition step (S4) is conducted using at least one selected from among a screen printing method, a rotary screen printing method, an offset printing method, a gravure printing method, a pad printing method, a flexo printing method, a letterpress printing method, and a printing method that uses a soft mold, and combinations thereof.

21. The method of claim 1, wherein, in the deposition step (S4), the substrate having the dry film resist formed thereon is heated.

22. The method of claim 1, which further comprises a drying step after the deposition step (S4).

23. The method of claim 1, which further comprises; after the deposition step (S4), a step of either inducing a photochemical reaction such as photocuring, or inducing curing using an electron beam.

24. The method of claim 1, which further comprises, after the deposition step (S4), a step of inducing the chemical reaction of the functional material by chemical treatment such as a reduction reaction or a displacement reaction.

25. The method of claim 1, which further comprises, after the deposition step (S4), a step of changing the phase of the functional material from a liquid phase to a solid phase.

26. The method of claim 1, which further comprises, after the deposition step (S4), a calcining step of heating the functional material above 100° C. to improve the properties of the functional material.

27. The method of claim 1, which further comprises, after the deposition step (S4), a step of irradiating the pattern with a laser or plasma beam to improve the properties of the functional material.

28. The method of claim 1, which further comprises, after the deposition step (S4), but before the dry film resist removal step (S5), a step of removing unnecessary functional material remaining on the dry film resist using a blade, a scraper or a wiper.

* * * * *